United States Patent
Kim et al.

(10) Patent No.: US 12,278,093 B2
(45) Date of Patent: *Apr. 15, 2025

(54) PLASMA ETCHING METHOD USING PENTAFLUOROPROPANOL

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 199 days.

This patent is subject to a terminal disclaimer.

(21) Appl. No.: 17/923,123

(22) PCT Filed: Mar. 2, 2021

(86) PCT No.: PCT/KR2021/002530
§ 371 (c)(1),
(2) Date: Nov. 3, 2022

(87) PCT Pub. No.: WO2021/225263
PCT Pub. Date: Nov. 11, 2021

(65) Prior Publication Data
US 2023/0178341 A1 Jun. 8, 2023

(30) Foreign Application Priority Data
May 4, 2020 (KR) .......................... 10-2020-0053305

(51) Int. Cl.
*H01L 21/311* (2006.01)
*H01J 37/32* (2006.01)

(52) U.S. Cl.
CPC .. *H01J 37/32449* (2013.01); *H01L 21/31116* (2013.01); *H01J 2237/334* (2013.01)

(58) Field of Classification Search
None
See application file for complete search history.

(56) References Cited

U.S. PATENT DOCUMENTS

| 6,514,425 B1 * | 2/2003 | Sekiya | H01L 21/3065 |
| | | | 438/723 |
| 2007/0187362 A1 * | 8/2007 | Nakagawa | C23F 4/00 |
| | | | 216/81 |

(Continued)

FOREIGN PATENT DOCUMENTS

| JP | 2001077084 A | * 3/2001 |
| JP | 2001-517868 A | 10/2001 |

(Continued)

OTHER PUBLICATIONS

JP-2001077084 With machine translation (Year: 2001).*
International Search Report for PCT/KR2020/002530 dated, Jun. 18, 2021 (PCT/ISA/210).

*Primary Examiner* — Shamim Ahmed
(74) *Attorney, Agent, or Firm* — Sughrue Mion, PLLC

(57) ABSTRACT

A plasma etching method is disclosed. The plasma etching method comprises: a first step for vaporizing liquid pentafluoropropanol (PFP); a second step for supplying discharge gas comprising the vaporized PFP and argon gas into a plasma chamber in which an object to be etched is placed; and a third step for discharging the discharge gas to generate plasma and etching the object by using the plasma.

9 Claims, 10 Drawing Sheets

(56) References Cited

U.S. PATENT DOCUMENTS

| | | | | |
|---|---|---|---|---|
| 2017/0243756 A1* | 8/2017 | Matsuura | ............ | H01J 37/3244 |
| 2019/0027368 A1* | 1/2019 | Matsuura | .......... | H01L 21/31116 |
| 2020/0166836 A1* | 5/2020 | Saito | .................... | G03F 7/0002 |

FOREIGN PATENT DOCUMENTS

| | | | |
|---|---|---|---|
| JP | 2003-287807 A | 10/2003 |
| JP | 2013-030531 A | 2/2013 |
| KR | 10-2001-0024828 A | 3/2001 |
| KR | 10-2001-0033793 A | 4/2001 |
| KR | 10-2014-0090241 A | 7/2014 |

* cited by examiner 200 nm hole pattern

PLASMA ETCHING METHOD USING PENTAFLUOROPROPANOL

FIELD

The present disclosure relates to a plasma etching method using pentafluoropropanol (PFP) with a low global warming potential as a discharge gas.

DESCRIPTION OF RELATED ART

Demand for a structure having a high aspect ratio is increasing due to high density of an integrated circuit and miniaturization of an element in a semiconductor device. In general, the high aspect ratio structure is fabricated in an insulating layer for electrically separating the structure from a conductive layer. In order to manufacture such a high aspect ratio structure, a scheme of plasma etching silicon oxide ($SiO_2$) is widely used. Currently, in the plasma etching process of silicon oxide, perfluorocarbon (PFC) gas such as $CF_4$, $C_2F_6$, $C_3F_6$, $C_3F_8$, and $C_4F_8$ is mainly used. The PFC gas generates various active species under plasma. In this regard, using $CF_8$ active species, a fluorocarbon thin film as a carbon-based polymer is deposited on a substrate surface, thereby protecting a mask, and serving as a source of an etching agent to improve a selectivity with respect to the mask.

However, the fluorocarbon thin film deposited during the plasma etching may interfere with diffusion of reactive ions and radicals depending on a thickness thereof, thereby lowering an etch rate. Further, excessive deposition of the fluorocarbon thin film on a wall face of an etched structure may cause etching stop, such that a target etched depth is not achieved, and, further, a diameter of a bottom of the etched structure is smaller than a diameter of the mask.

Further, PFC is one of 6 major greenhouse gases ($CO_2$, $CH_4$, $N_2O$, HFC, PFC, $SF_6$). The PFC gas is chemically stable and has a long average residence time in the atmosphere and thus a high global warming potential (GWP) value which is higher, by 6500 times or greater, than GWP of $CO_2$. Thus, the small amount of the PFC gas may greatly contribute to the global warming effect. In addition, as a proportion of the etching process in a semiconductor device manufacturing process increases, an annual discharge amount of the PFC gas is continuously increasing. Thus, in order to reduce the emission of PFC gas, various methods such as PFC gas decomposition, separation and collection have been employed. However, those methods have fundamental limits due to the PFC gas having the high GWP.

Therefore, there are a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

DISCLOSURE

Technical Purposes

One purpose of the present disclosure is to provide a plasma etching method using pentafluoropropanol (PFP) having a low global warming potential as a discharge gas in place of the conventional PFC gas having a high global warming potential.

Technical Solutions

One aspect of the present disclosure provides a plasma etching method comprising: a first step of vaporizing liquid pentafluoropropanol (PFP); a second step of supplying a discharge gas containing the vaporized pentafluoropropanol (PFP) and argon gas to a plasma chamber in which an etching target is disposed; and a third step of discharging the discharge gas to generate plasma and of performing plasma etching on the etching target using the generated plasma.

In one implementation, in order to vaporize the liquid pentafluoropropanol (PFP) and then supply the vaporized pentafluoropropanol (PFP) to the etching chamber, a first container accommodating the liquid pentafluoropropanol (PFP) therein may be heated to a first temperature equal to or higher than a boiling point of the pentafluoropropanol (PFP), and a connecting pipe connecting the first container to the etching chamber may be heated to a second temperature higher than the first temperature.

In one implementation, the vaporized pentafluoropropanol (PFP) and the argon gas may be supplied to the etching chamber at a flow rate ratio in a range of 2:3 to 1:9.

In one implementation, the vaporized pentafluoropropanol (PFP) and the argon gas may be supplied to the etching chamber at a flow rate ratio in a range of 2:3 to 1:4.

In one implementation, the vaporized pentafluoropropanol (PFP) and the argon gas may be supplied to the etching chamber at a flow rate ratio in a range of 2:3 to 3:7.

In one implementation, the discharge gas may further contain oxygen. In one implementation, the pentafluoropropanol (PFP) gas, the argon gas and the oxygen may be supplied to the etching chamber so that a ratio of a flow rate of the oxygen and a sum of a flow rate of the pentafluoropropanol (PFP) gas and the flow rate of the argon gas is in a range of 1:3 to 1:99.

In one implementation, a bias voltage in a range of −200V to −1400V may be applied to a substrate supporting the etching target thereon in the etching chamber during the third step.

In one implementation, the etching target may be a silicon oxide thin film.

Technical Effects

According to the present disclosure, greenhouse gas emission may be reduced using PFP having a low Global Warming Potential (GWP), compared to an etching process using the conventional PFC gas, thereby providing an eco-friendly plasma etching method. Further, the plasma etching may be performed using a mixture of the Ar gas and the PFP, such that the etching target may be etched with excellent etching properties. When the plasma etching may be performed using the mixture of the Ar gas, the PFP and the 02 gas, an etch rate of a specific etching target may be increased, and a straighter and deeper high-aspect-ratio etched structure may be provided.

DETAILED DESCRIPTIONS

Figure 1:
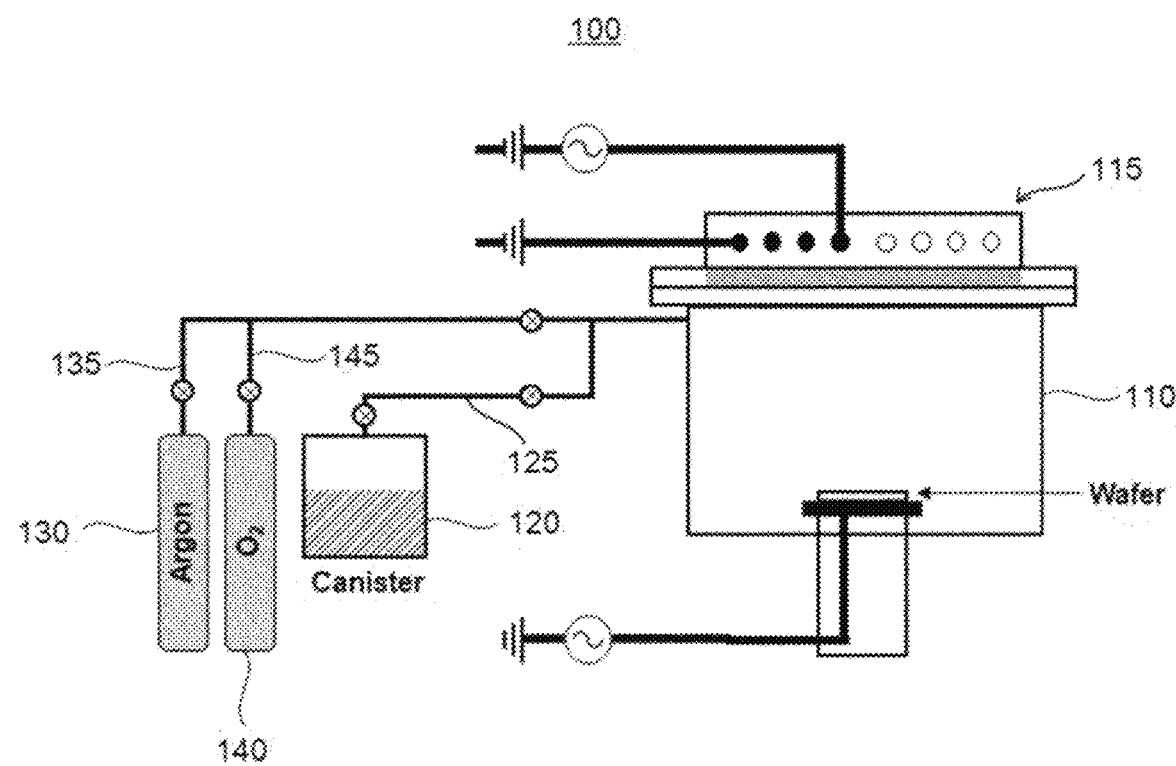
FIG. 1 is a schematic diagram of a plasma etching apparatus capable of performing a plasma etching method according to an embodiment of the present disclosure.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram of a plasma etching apparatus capable of performing a plasma etching method according to an embodiment of the present disclosure.

Referring to FIG. 1, the plasma etching method according to an embodiment of the present disclosure may include providing a discharge gas containing pentafluoropropanol (PFP) gas and argon (Ar) gas into a plasma chamber in which an etching target is disposed, such that plasma etching on the etching target is performed.

The etching target is not particularly limited, but may be a silicon oxide layer, a silicon nitride layer, or the like, which generally functions as an insulating layer in a semiconductor device manufacturing process. For example, the etching target may be a silicon oxide layer such as a silicon dioxide ($SiO_2$) layer.

In one embodiment, the discharge gas may further contain oxygen ($O_2$) gas in addition to the pentafluoropropanol (PFP) and the argon.

The PFP is composed of 3 carbons, 3 hydrogens, 1 oxygen, and 5 fluorines, and has a boiling point of about 80° C. and thus may exist in a liquid state at room temperature. Specific physical properties of the PFP used in the present disclosure are shown in Table 1 below.

TABLE 1

| Chemical Structure | F—\|—F<br>F—\|—F<br>F—\|<br>H—\|—F<br>HO—\|<br>H |
|---|---|
| Molecular formula | $C_3H_3F_5O$ |
| Molecular Weight (g/mol) | 150 |
| Boiling Point (° C.) | 80 |
| Density (g/mL) | 1.505 @ 20° C. |
| Global Warming Potential (GWP) | 19 |

In one embodiment, the plasma etching method according to the embodiment of the present disclosure may be performed using the etching apparatus shown in FIG. 1. In one embodiment, the etching apparatus 100 may include an etching chamber 110, a first container 120, a second container 130 and a third container 140. The etching chamber 110 may be coupled to a plasma source 115 and may have a discharge space accommodating an etching target (wafer) therein. The discharge space may receive the discharge gas from the first to third containers 120, 130, and 140, and the plasma source 115 may apply a discharge voltage to the discharge gas to generate plasma.

The first to third containers 120, 130, and 140 may be connected to the etching chamber 110 via first to third connection pipes 125, 135, and 145, respectively. pentafluoropropanol (PFP) in a liquid state may be accommodated in the first container 120, and argon gas and oxygen gas may be accommodated in the second and third containers 130 and 140, respectively.

The pentafluoropropanol (PFP) accommodated in the first container 120 has a boiling point of 80° C. and thus exists as a liquid at room temperature. Thus, in order that the liquid pentafluoropropanol (PFP) uniformly flows into the etching chamber 110, the pentafluoropropanol (PFP) may be vaporized and then supplied to the discharge space of the etching chamber 110. In one embodiment, the vaporization of the pentafluoropropanol (PFP) may be carried out by heating the first container 120 accommodating the liquid pentafluoropropanol (PFP) therein and the first connection pipe 125 connecting the first container 120 and the etching chamber 110 to each other to a temperature higher than the boiling point of the pentafluoropropanol (PFP). In one example, in one embodiment, in order that variation in a flow rate of the pentafluoropropanol (PFP) being provided to the etching chamber 110 due to droplet splashing is prevented, the first container 120 may be heated to a first temperature higher than the boiling point of the pentafluoropropanol (PFP), while the first connection pipe 125 may be heated to a second temperature higher than the first temperature. For example, the first container 120 may be heated to a temperature of about 90 to 110° C. using a heating jacket, and the first connection pipe 125 may be heated to a temperature of about 120 to 140° C. In one example, a mass flow controller may be installed at an outlet of the first connection pipe 125 such that the vaporized pentafluoropropanol (PFP) flows to the discharge space of the etching chamber 110 at a constant flow rate.

The argon gas accommodated in the second container 130 and the oxygen gas accommodated in the third container 140 may be provided to the discharge space of the etching chamber 110 via the second connection pipe 135 and the third connection pipe 145, respectively different from the first connection pipe 125.

According to the present disclosure, when the Ar gas and the pentafluoropropanol (PFP) gas are fed to the discharge space of the etching chamber 110 and then the plasma is generated, a plasma density may be increased, and anisotropic etching of the etching target may be performed via ion bombardment. Specifically, when electropositive Ar is added to electronegative fluorocarbon plasma, the plasma density may be improved such that decomposition of a precursor such as pentafluoropropanol (PFP) may be increased, thereby greatly affecting a gas phase and a surface chemistry. For example, a representative change in the surface chemistry due to the addition of Ar may be a decrease in a fluorine content of a steady state fluorocarbon formed on a surface. Further, since Ar is electropositive, Ar moves in an accelerated manner toward a negatively charged wafer to conduct ion bombardment thereon. Accordingly, the anisotropic etching may be achieved when a hole is formed in the wafer.

In one embodiment of the present disclosure, when the etching target is made of silicon oxide, the pentafluoropropanol (PFP) gas and the Ar gas may be provided to the discharge space of the etching chamber 110 at a flow rate ratio in a range of about 2:3 (=40:60) to 1:9 (=10:90). When the flow rate ratio of the pentafluoropropanol (PFP) gas and the Ar gas is lower than 2:3 (=40:60), there may be a problem that the etch rate on the etching target is too low. When the flow rate ratio of the pentafluoropropanol (PFP) gas and the Ar gas exceeds 1:9 (=10:90), there is a problem in that the etch rate is significantly lowered due to a decrease in an amount of an etchant capable of etching the etching target. For example, when the etching target is made of silicon oxide, the pentafluoropropanol (PFP) gas and the Ar gas may be provided to the discharge space of the etching chamber 110 at a flow rate ratio in a range of about 2:3 (=40:60) to 1:4 (=20:80), or about 2:3 (=40:60) to 3:7 (=30:70).

In one embodiment, when the discharge gas further includes oxygen ($O_2$) gas in addition to the pentafluoropropanol (PFP) and the argon, the oxygen gas may appropriately control a thickness of the fluorocarbon thin film generated by the plasma etching to improve etching efficiency. For example, adding the oxygen ($O_2$) gas thereto may allow an excessive thickness of the fluorocarbon thin film to be reduced, thereby preventing inhibition of diffusion of reactive ions and radicals, such that the etching target may be etched at an excellent etch rate. Further, excessive deposition of the fluorocarbon thin film on a wall face of the etched structure may be prevented, such that unwanted etching stop may be prevented and thus etching may be performed to a desired depth. Thus, when an etched structure is formed in the etching target using a hole pattern mask according to the plasma etching method of the present disclosure, a high aspect ratio etched structure in which a diameter of the etched structure is equal to a diameter of the hole pattern mask may be formed. However, when a content of the oxygen ($O_2$) gas in the discharge gas is excessively high, the formation of the fluorocarbon thin film serving as a source of the etching target such as silicon oxide is excessively suppressed, thereby inhibiting anisotropic etching of the etching target. In one embodiment, the pentafluoropropanol (PFP) gas, the oxygen ($O_2$) gas, and the argon gas may be provided to the etching chamber such that a ratio of a flow rate of the oxygen ($O_2$) gas and a sum of the flow rate of the pentafluoropropanol (PFP) gas and the flow rate of the argon gas is in a range of about 1:9 (=10:90) to 1:99. For example, the pentafluoropropanol (PFP) gas, the oxygen ($O_2$) gas, and the argon gas may be provided to the etching chamber such that a ratio of a flow rate of the oxygen ($O_2$) gas and a sum of the flow rate of the pentafluoropropanol (PFP) gas and the flow rate of the argon gas is about 7:93.

In one example, in the plasma etching method according to the embodiment of the present disclosure, a bias voltage applied to a substrate supporting the etching target thereon may be in a range of −200V to −1400V. When the bias voltage is lower than −200V, there may be a problem that the etch rate on the etching target is too low. When the bias voltage is higher than −1400V, there may be a problem of increasing only power consumption without further improvement of the etch rate.

Further, in the plasma etching method according to the embodiment of the present disclosure, a source power applied to a plasma source 115 to generate the plasma of the discharge gas may be about 200 W or higher. When the source power is lower than 200 W, there may be a problem that the etch rate on the etching target is remarkably low. In one example, the source power applied to the plasma source 115 to reduce power consumption may be in a range of 200 W inclusive to 1000 W exclusive.

According to the present disclosure, pentafluoropropanol (PFP) has a 19 of GWP, which is remarkably lower than that of the conventional PFC gas. Thus, a mixed gas of pentafluoropropanol (PFP) and argon (Ar) or a mixed gas of pentafluoropropanol (PFP) and argon (Ar) and oxygen ($O_2$) may be provided as a discharge gas to perform the plasma etching process. Thus, compared to the plasma etching process using the existing PFC gas, emission of greenhouse gas may be significantly reduced, and plasma etching may be performed at excellent etching properties.

In particular, according to the plasma etching process of the present disclosure, a deposition rate of the fluorocarbon thin film on the etching target may be reduced and the etch rate on the etching target may be increased, so that the etching target may be etched while appropriately controlling the thickness of the fluorocarbon thin film. When plasma etching is performed on the etching target using a hole pattern mask, a high aspect ratio etched structure in which the diameter of the hole pattern mask and the diameter of the etched structure is substantially equal to each other may be formed. A more detailed description thereof will be described with reference to following examples of the present disclosure.

Hereinafter, more specific examples and experimental examples will be described. However, the following examples are only some implementations of the present disclosure, and the scope of the present disclosure is not limited to the following examples.

Example

Plasma etching was performed on a $SiO_2$ thin film formed on a surface of a silicon substrate under various conditions and using a mixed gas of pentafluoropropanol (PFP) and argon as a discharge gas. In this regard, in vaporizing the liquid pentafluoropropanol (PFP) and supplying the vaporized pentafluoropropanol (PFP) to the etching chamber, a canister accommodating therein the liquid pentafluoropropanol (PFP) was heated to 100° C., and a connecting line connecting the canister and the etching chamber to each other was heated to 130° C.

Experimental Example 1: Analysis of Etch Rate and Radical Intensity Based on Percentage of Argon Gas Flow Rate FIG. 2 is a graph measuring a change in an etch rate of a $SiO_2$ thin film based on a percentage of an argon gas flow rate to a total flow rate of a discharge gas composed of PFP and argon (Ar) in a plasma etching process on the $SiO_2$ thin film under a condition shown in Table 2.

TABLE 2

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | PFP/Ar | 30 | 10 | 15 |

Figure 2:
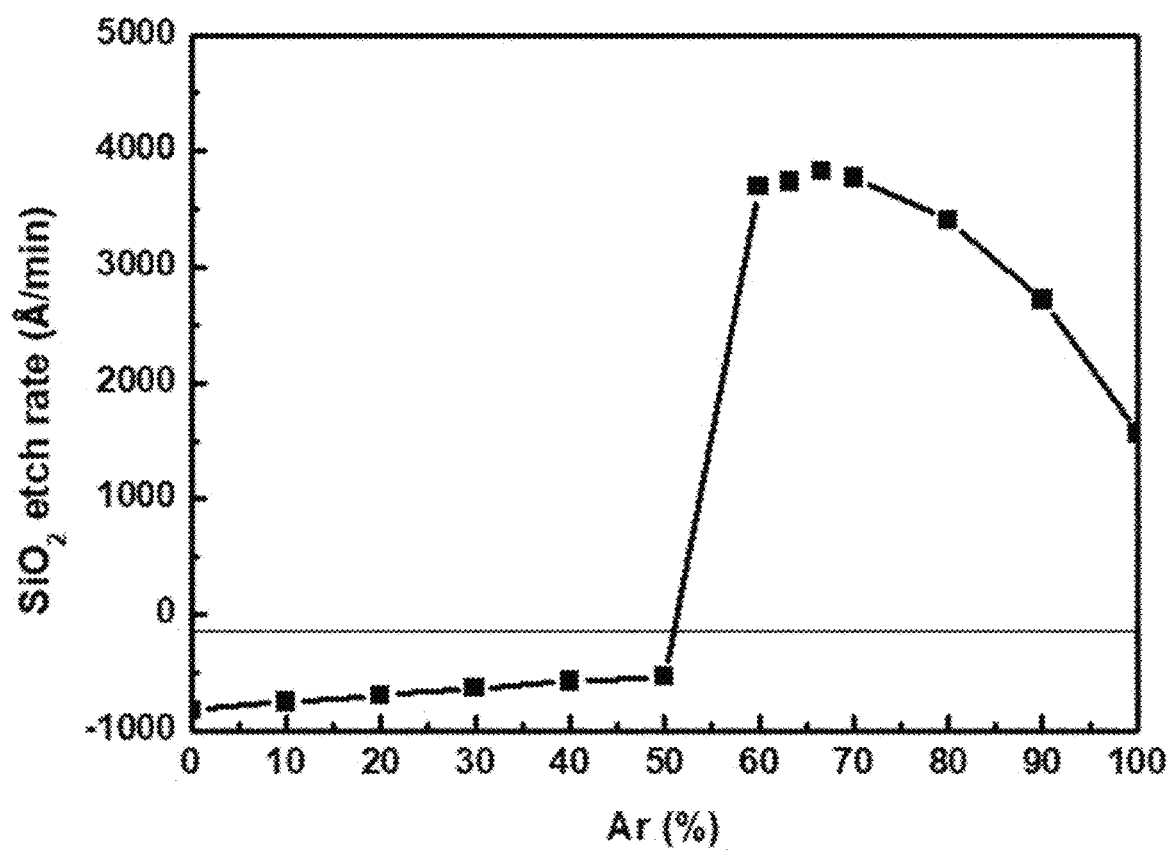
FIG. 2 is a graph measuring a change in an etch rate of a $SiO_2$ thin film based on a percentage of an argon gas flow rate to a total flow rate of a discharge gas composed of PFP and argon (Ar) in a plasma etching process on the $SiO_2$ thin film under a condition shown in Table 2.

Referring to FIG. 2 together with Table 2, it was identified that the etch rate was significantly increased when a mixed gas in which PFP and Ar gas were mixed with each other at a specific flow rate ratio was employed as a discharge gas. Specifically, it is identified that when a percentage of a flow rate of Ar to a total flow rate of the discharge gas exceeds about 50%, the etch rate increases as the percentage of the flow rate of Ar increases. When a percentage of a flow rate of Ar to a total flow rate of the discharge gas is in a range of about 50% to 60%, the etch rate rapidly increases. On the contrary, when the percentage of the Ar flow rate exceeds about 70%, the etch rate decreases as the percentage of the flow rate of Ar increases. The decrease in the etch rate may be expected due to decrease in an amount of etchant capable of etching $SiO_2$. Based on the above results, a percentage of a flow rate of Ar to a total flow rate of the discharge gas is preferably in a range of about 60 to 90%, about 60 to 80%, or about 60% to 70%.

Figure 3:
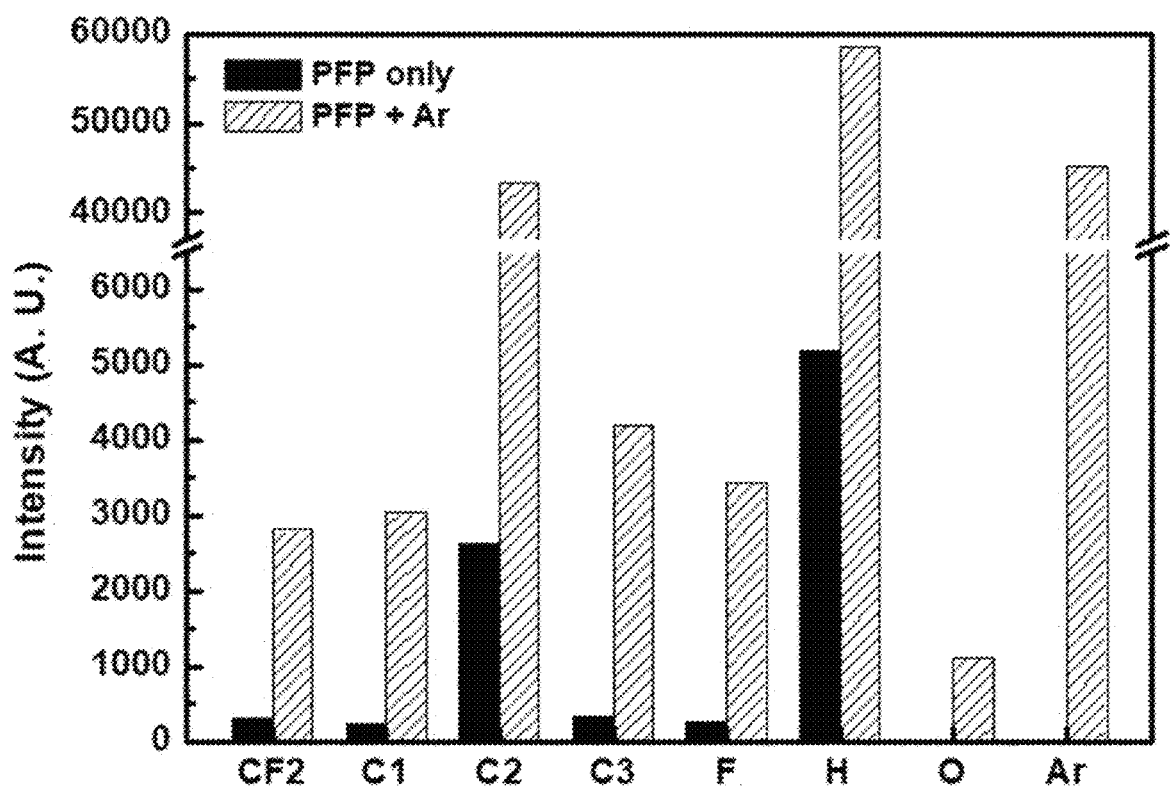
FIG. 3 is a graph measuring a change in an intensity of radicals based on a percentage of an argon gas flow rate to a total flow rate of a discharge gas composed of PFP and argon (Ar) in a plasma etching process on the $SiO_2$ thin film under a condition shown in Table 2.

FIG. 3 is a graph measuring a change in an intensity of radicals based on a percentage of an argon gas flow rate to a total flow rate of a discharge gas composed of PFP and argon (Ar) in a plasma etching process on the $SiO_2$ thin film under a condition shown in Table 2. In this regard, the intensity of the radicals was measured using optical emission spectroscopy (OES).

Referring to FIG. 3 together with Table 2, when the percentage of the Ar flow rate to the total flow rate of the discharge gas is about 67%, all of intensities of CF2, C1, C2, C3, F, H, O, and Ar radicals increase, compared with a case where the percentage of the Ar flow rate is about 0%. The increase in the intensity of radicals means an increase in an amount of generated radicals in the plasma. In particular, as a content of F radicals in the plasma increases, the etch rate of $SiO_2$ increases. Therefore, when Ar is contained in the discharge gas at a specific percentage of a flow rate, the etch rate of $SiO_2$ increases due to the increase in the amount of F radicals in the plasma.

Figure 4:
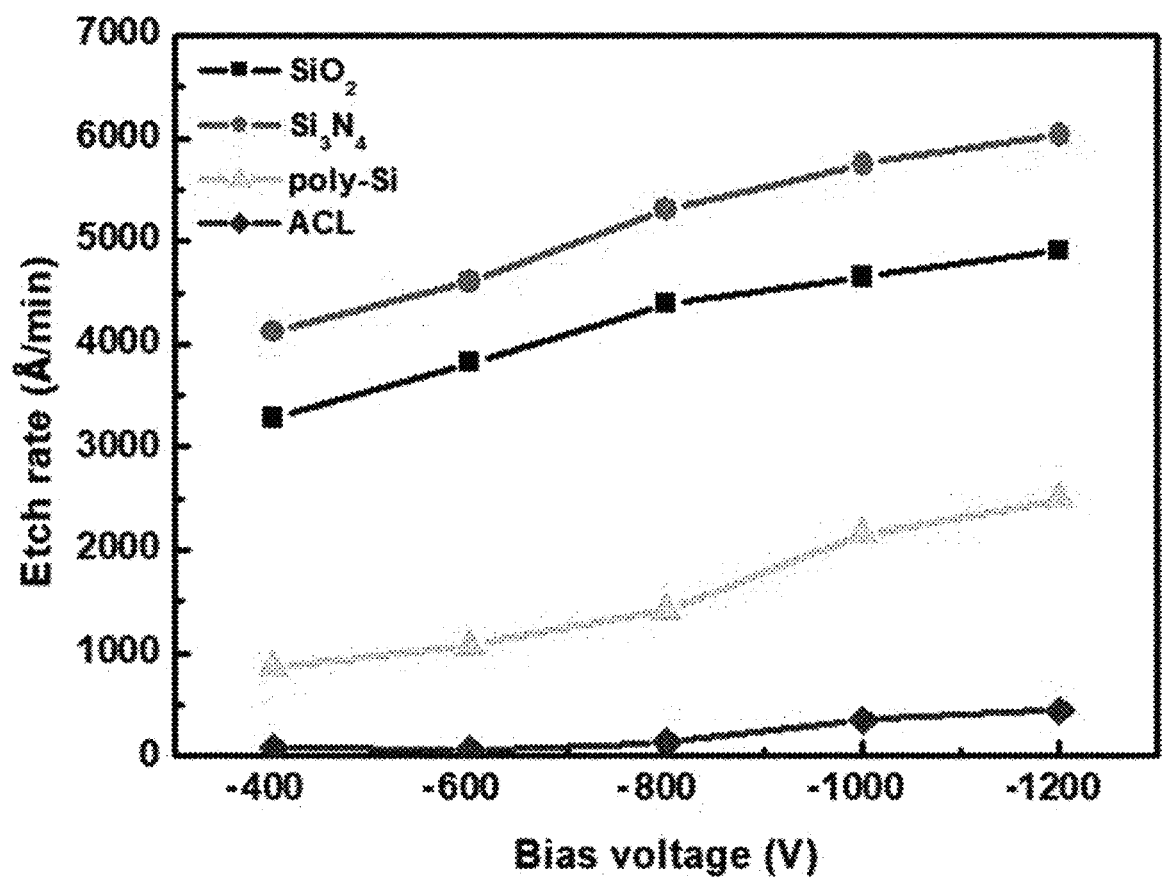
FIG. 4 is a graph measuring a change in an etch rate based on a bias voltage in a plasma etching process on each of various thin films ($Si_3N_4$, $SiO_2$, poly-Si and ACL) under a condition shown in Table 3.

Experimental Example 2: Analysis of Etch Rate, Radical Intensity and Etched Structure Based on Bias Voltage FIG. 4 is a graph measuring a change in an etch rate based on a bias voltage in a plasma etching process on each of various thin films ($Si_3N_4$, $SiO_2$, poly-Si and ACL) under a condition shown in Table 3. In this regard, a percentage of the flow rate of Ar to a total flow rate of the discharge gas was about 67%.

TABLE 3

| Source power (W) | Bias voltage (V) | Discharge Gas | Total Flow Rate (sccm) | Pressure (mTorr) | Substrate Temperature (° C.) |
|---|---|---|---|---|---|
| 250 | −400 to −1200 | PFP/Ar | 30 (X/Y = 10/20) | 10 | 15 |

Referring to FIG. 4 together with Table 3, it was identified that the etch rate of each of all of the $Si_3N_4$, $SiO_2$, poly-Si and ACL thin films increased as the bias voltage increased. Further, it was identified that the etch rate of the $Si_3N_4$ thin film>the etch rate of the $SiO_2$ thin film>the etch rate of the poly-Si thin film>the etch rate of the ACL thin film.

Figure 5:
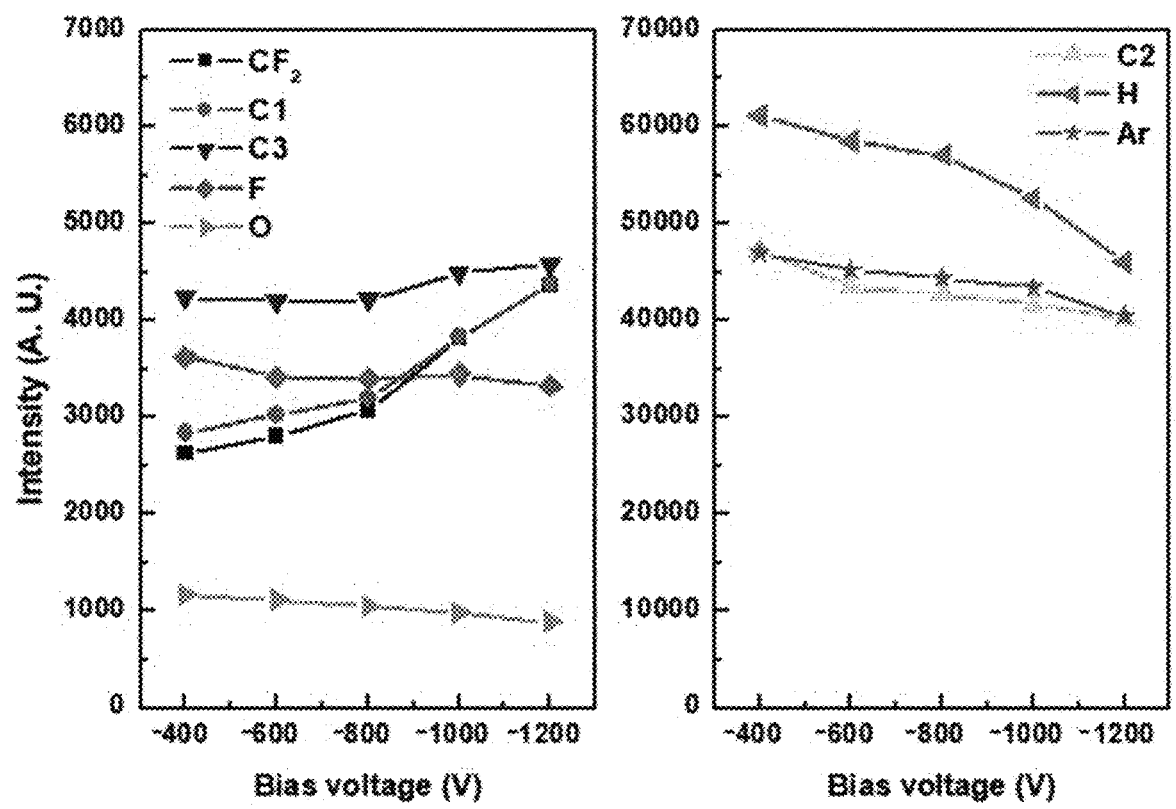
FIG. 5 is a graph measuring a change in an intensity of radicals based on a bias voltage in a plasma etching process on a $SiO_2$ thin film under a condition shown in Table 3.

FIG. 5 is a graph measuring a change in an intensity of radicals based on a bias voltage in a plasma etching process on a $SiO_2$ thin film under a condition shown in Table 3. In this regard, the percentage of the flow rate of argon to the total flow rate of the discharge gas was about 67%, and the intensity of radicals was measured using optical emission spectroscopy (OES).

Referring to FIG. 5 together with Table 3, as the bias voltage increased, the intensities of $CF_2$, C1 and C3 radicals increased, while the intensities of F, O, C2, H and Ar radicals decreased. The increase in the intensities of the $CF_2$, C1 and C3 radicals may be expected due to release thereof from the fluorocarbon film deposited on a chamber wall.

Figure 6:
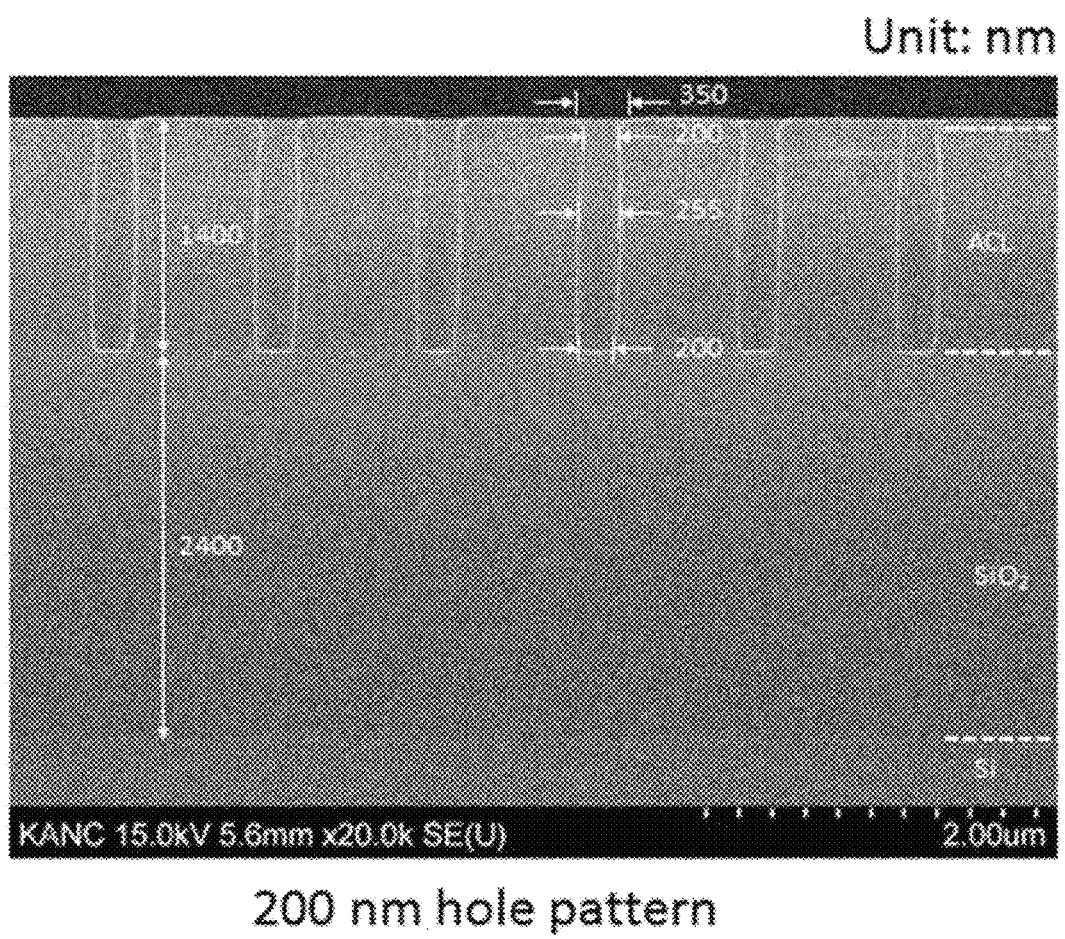
FIG. 6 is an FE-SEM image of each of a silicon substrate, an $SiO_2$ thin film covering a surface thereof, and an etching mask formed thereon before plasma etching. A thickness of the $SiO_2$ thin film is 2400 nm, and a thickness of the etching mask is about 1400 nm. The etching mask includes an ACL layer and a SiON layer formed thereon, and thicknesses thereof are about 1350 nm and 50 nm, respectively. Diameters of hole patterns therein are about 200 nm.
Figure 7:
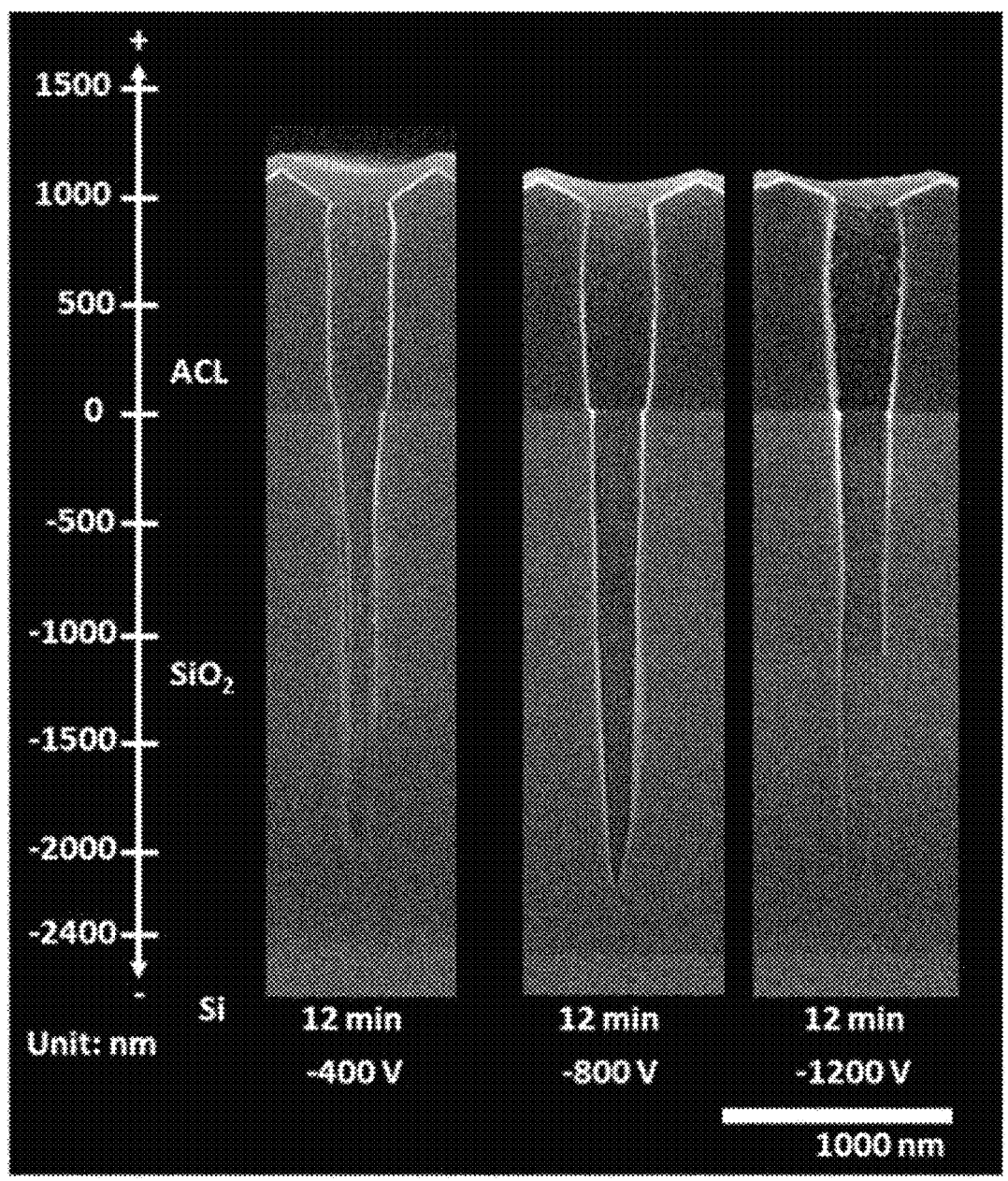
FIG. 7 is a FE-SEM image showing each of etched profiles after plasma etching was performed on the $SiO_2$ thin film of the structure of FIG. 6 for 12 minutes while various bias voltages are applied, under a condition shown in Table 4.

FIG. 6 is an FE-SEM image of each of a silicon substrate, an $SiO_2$ thin film covering a surface thereof, and an etching mask formed thereon before plasma etching. FIG. 7 is a FE-SEM image showing each of etched profiles after plasma etching was performed on the $SiO_2$ thin film of the structure of FIG. 6 for 12 minutes while various bias voltages are applied, under a condition shown in Table 4.

TABLE 4

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −400, −800, −1200 | PFP/Ar | 30 (X/Y = 10/20) | 10 | 15 | 12 |

Referring to FIG. 6 and FIG. 7 together with Table 4, it was identified that there was no substantial change in the etched depth of the $SiO_2$ thin film based on change in the bias voltage. Specifically, it was identified that when the plasma etching was performed for 12 minutes at each of bias voltages of −400, −800, and 1200 V, the etched depth of all specimens failed to reach about 2400 nm as a depth to a bottom of the $SiO_2$ film, but reached a depth of about 2000 to 2100 nm. Referring to FIG. 5 together with FIG. 6, it may be identified that as the bias voltage is increased, the amount of the $CF_2$ radicals involved in the deposition increase, while an amount of the F radicals involved in the etching is slightly decreased. Thus, it may be identified that the change in the etched depth based on the change in the bias voltage is insignificant. That is, as the bias voltage increases, the ion energy increases whereas a $F/CF_2$ ratio decreases. Thus, it may be interpreted that a difference between the etched depth using −400 V and the etched depth using −1200 V is insignificant.

Experimental Example 3: Analysis of Etch Rate, Radical Intensity and Etched Structure Based on Addition of Oxygen ($O_2$)

Figure 8:
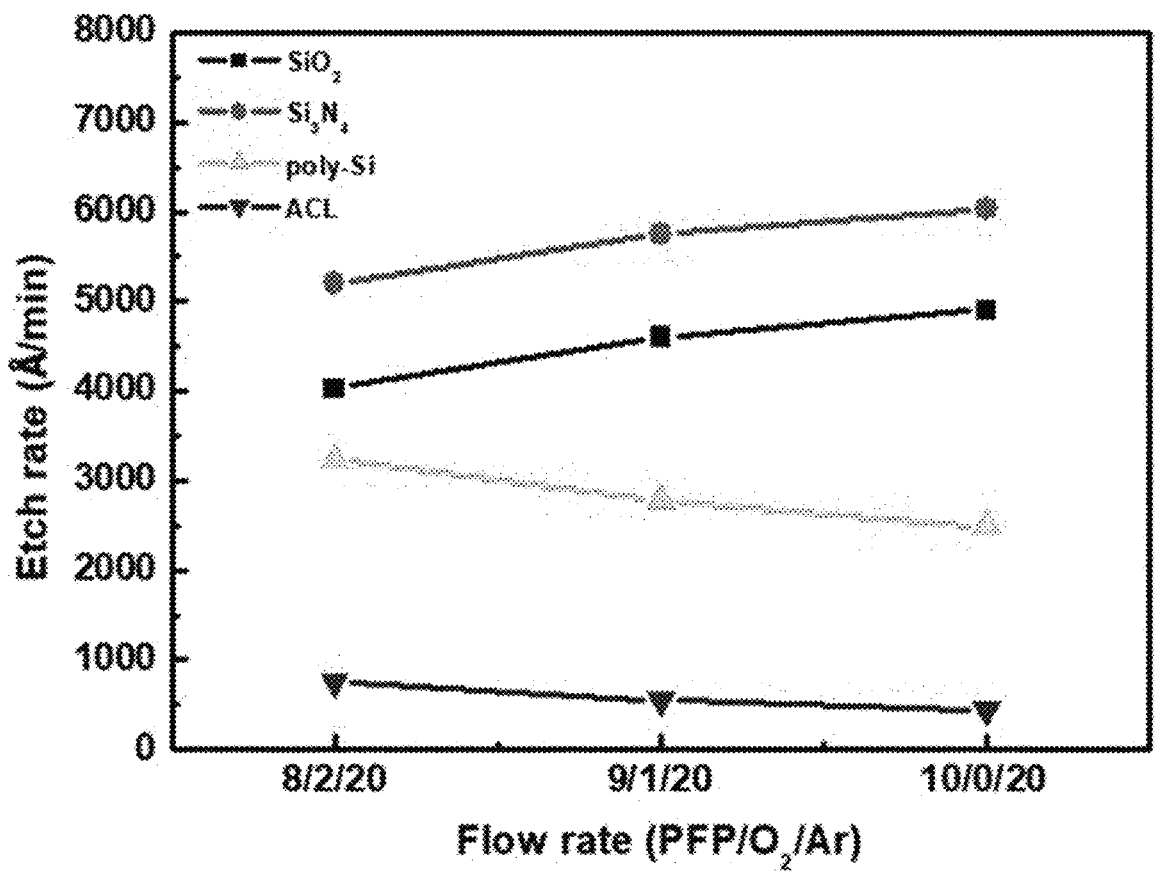
FIG. 8 is a graph measuring a change in an etch rate based on a percentage of an oxygen flow rate in a plasma etching process on each of various thin films ($Si_3N_4$, $SiO_2$, poly-Si and ACL) under a condition shown in Table 5.

FIG. 8 is a graph measuring a change in an etch rate based on a percentage of an oxygen flow rate in a plasma etching process on each of various thin films ($Si_3N_4$, $SiO_2$, poly-Si and ACL) under a condition shown in Table 5.

TABLE 5

| Source power (W) | Bias voltage (V) | Discharge Gas | Total Flow Rate (sccm) | Pressure (mTorr) | Substrate Temperature (° C.) |
|---|---|---|---|---|---|
| 250 | −1200 | PFP/O$_2$/Ar | 30 (X/Y/Z = 8/2/20 to 10/0/20) | 10 | 15 |

Referring to FIG. 8 together with Table 5, it is identified that as the percentage of the flow rate of PFP to a total flow rate of the discharge gas decreases and a percentage of a flow rate of oxygen to a total flow rate of the discharge gas increases, the etch rate of each of the $SiO_2$ thin film and the $Si_3N_4$ thin film decreases whereas the etch rate of each of the poly-Si thin film and the ACL thin film increases.

Figure 9:
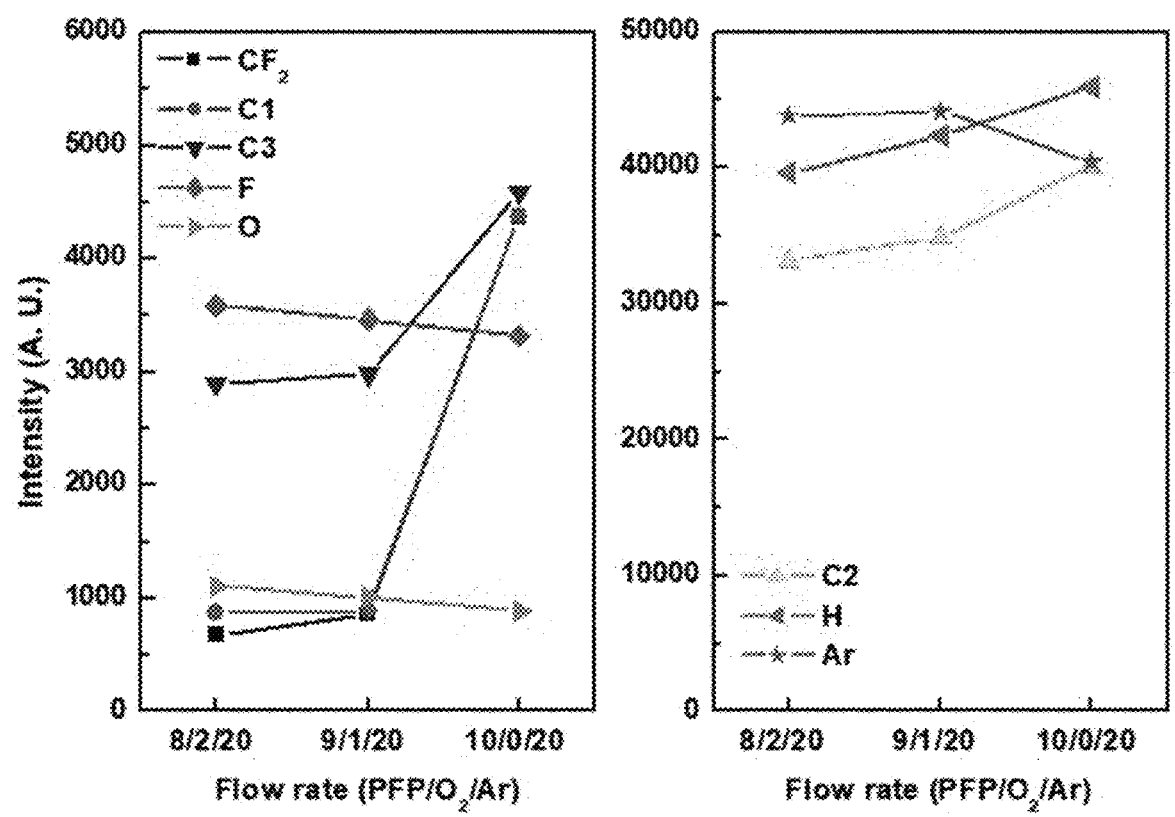
FIG. 9 is a graph measuring a change in an intensity of radicals based on a percentage of an oxygen flow rate in a plasma etching process on a $SiO_2$ thin film under a condition described in Table 5.

FIG. 9 is a graph measuring a change in an intensity of radicals based on a percentage of an oxygen flow rate in a plasma etching process on a $SiO_2$ thin film under a condition described in Table 5. In this regard, the intensity of radicals was measured using optical emission spectroscopy (OES).

Referring to FIG. 9 together with Table 5, it is identified that as the percentage of the flow rate of PFP to a total flow rate of the discharge gas decreases and a percentage of a flow rate of oxygen to a total flow rate of the discharge gas increases, the intensities of the F and O radicals increase, whereas the intensities of the $CF_2$, C1, C2, C3 and H radicals decrease.

These results may be interpreted that when oxygen is added to the discharge gas, carbon radicals and hydrogen radicals (H radicals) generated from the PFP are converted into $CO_x$ and $H_2O$, and thus are removed, while F is separated from $CF_8$ such that the amount of the F radical increases.

Referring to FIG. 8 together with FIG. 9, it may be identified that because $SiO_2$ is etched with $CF_x$ and F and $Si_3N_4$ is etched with $CF_x$, F and H, an amount of the etchant decreases and thus the etch rate of each of the $SiO_2$ and $Si_3N_4$ thin films decreases as the percentage of the oxygen flow rate to a total flow rate of the discharge gas increases. On the contrary, it may be identified that since poly-Si is etched with F and ACL is etched with O, the etch rate of each of the poly-Si and ACL thin films increase as the percentage of the oxygen flow rate to a total flow rate of the discharge gas increases.

Figure 10:
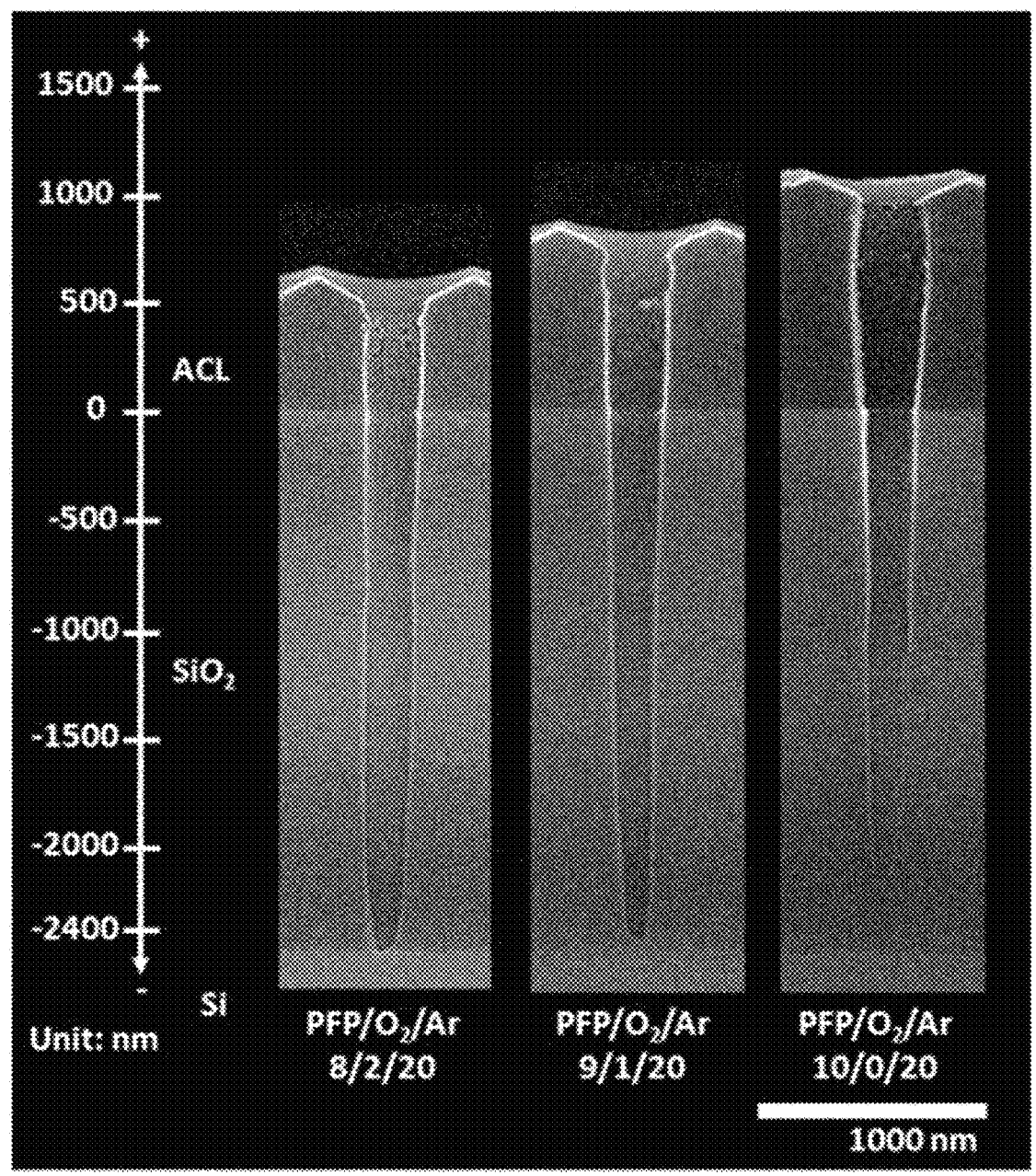
FIG. 10 is a FE-SEM image showing each of etched profiles after plasma etching was performed on a $SiO_2$ thin film for 12 minutes using a discharge gas having each of various oxygen flow rate percentages under a condition shown in Table 6.

FIG. 10 is a FE-SEM image showing each of etched profiles after plasma etching was performed on a $SiO_2$ thin film for 12 minutes using a discharge gas having each of various oxygen flow rate percentages under a condition shown in Table 6.

TABLE 6

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −1200 | PFP/O$_2$/Ar | 30 (X/Y/Z = 8/2/20 to 10/0/20) | 10 | 15 | 12 |

Referring to FIG. 10 together with Table 6, it was identified that as a percentage of the flow rate of PFP to a total flow rate of the discharge gas decreased and a percentage of the flow rate of oxygen to a total flow rate of the discharge gas increased, the etched depth increased. Specifically, it was identified that the etched depth has reached a bottom (2400 nm) of the $SiO_2$ thin film under a condition that a flow rate of PFP/a flow rate of $O_2$/a flow rate of Ar was 8 sccm/2 sccm/20 sccm when a total flow rate was 30 sccm. As the percentage of the oxygen flow rate to the total flow rate of the discharge gas increased, the ACL mask was etched such that a height thereof was gradually decreasing. However, considering that the etched depth of the $SiO_2$ thin film reaches the bottom thereof, the reduced thickness of the ACL mask may be considered to be a sufficient thickness. The deeper and straighter etched profile may be obtained due to the oxygen addition into the discharge gas. This may be due to the fact that an amount of a fluorocarbon film deposited on a bottom and a wall surface of the hole is reduced due to decrease in an amount of $CF_8$ and carbon radicals in the $PFP/O_2/Ar$ plasma, and further the fluorocarbon thin film is removed with O radicals. Accordingly, when the oxygen gas is added to the discharge gas, profile distortion such as narrowing and etch stop may be reduced, and a straighter and deeper etched structure may be formed.

Although the present disclosure has been described above with reference to the preferred embodiments of the present disclosure, those skilled in the art may variously modify and change the present disclosure without departing from the spirit and scope of the present disclosure as described in the claims below.

What is claimed is:

1. A plasma etching method comprising:
a first step of vaporizing liquid pentafluoropropanol (PFP);
a second step of supplying a discharge gas containing the vaporized pentafluoropropanol (PFP) and argon gas to a plasma chamber in which an etching target is disposed; and
a third step of discharging the discharge gas to generate plasma and performing plasma etching on the etching target using the generated plasma.

2. The method of claim 1, wherein in order to vaporize the liquid pentafluoropropanol (PFP) and then supply the vaporized pentafluoropropanol (PFP) to the etching chamber, a first container accommodating the liquid pentafluoropropanol (PFP) therein is heated to a first temperature equal to or higher than a boiling point of the pentafluoropropanol (PFP), and a connecting pipe connecting the first container to the etching chamber is heated to a second temperature higher than the first temperature.

3. The method of claim 1, wherein the vaporized pentafluoropropanol (PFP) and the argon gas are supplied to the etching chamber at a flow rate ratio in a range of 2:3 to 1:9.

4. The method of claim 1, wherein the vaporized pentafluoropropanol (PFP) and the argon gas are supplied to the etching chamber at a flow rate ratio in a range of 2:3 to 1:4.

5. The method of claim 4, wherein the vaporized pentafluoropropanol (PFP) and the argon gas are supplied to the etching chamber at a flow rate ratio in a range of 2:3 to 3:7.

6. The method of claim 1, wherein the discharge gas further contains oxygen.

7. The method of claim 6, wherein the pentafluoropropanol (PFP) gas, the argon gas and the oxygen are supplied to the etching chamber so that a ratio of a flow rate of the oxygen and a sum of a flow rate of the pentafluoropropanol (PFP) gas and the flow rate of the argon gas is in a range of 1:3 to 1:99.

8. The method of claim 1, wherein a bias voltage in a range of −200V to −1400V is applied to a substrate supporting the etching target thereon in the etching chamber during the third step.

9. The method of claim 1, wherein the etching target is a silicon oxide thin film.

* * * * *